(12) United States Patent
Almarhoon et al.

(10) Patent No.: US 12,584,381 B2
(45) Date of Patent: Mar. 24, 2026

(54) HYDROCARBON GAS PRODUCTION SYSTEM

(71) Applicant: Saudi Arabian Oil Company, Dhahran (SA)

(72) Inventors: Hassan Almarhoon, Al Qatif (SA); Senan Bo Khamseen, Dhahran (SA)

(73) Assignee: Saudi Arabian Oil Company, Dhahran (SA)

( * ) Notice: Subject to any disclaimer, the term of this patent is extended or adjusted under 35 U.S.C. 154(b) by 1043 days.

(21) Appl. No.: 17/697,163

(22) Filed: Mar. 17, 2022

(65) Prior Publication Data

US 2023/0296005 A1 Sep. 21, 2023

(51) Int. Cl.
| | |
|---|---|
| *E21B 43/00* | (2006.01) |
| *E21B 41/00* | (2006.01) |
| *G06F 30/27* | (2020.01) |

(52) U.S. Cl.
CPC .............. *E21B 43/00* (2013.01); *E21B 41/00* (2013.01); *G06F 30/27* (2020.01); *E21B 2200/20* (2020.05)

(58) Field of Classification Search
CPC ....... G06F 30/27; E21B 41/00; E21B 2200/20
See application file for complete search history.

(56) References Cited

U.S. PATENT DOCUMENTS

| | | | |
|---|---|---|---|
| 6,182,756 B1 | 2/2001 | Garcia et al. | |
| 8,078,328 B2 | 12/2011 | Malki et al. | |
| 8,244,509 B2 * | 8/2012 | Banerjee | E21B 43/00 |
| | | | 702/11 |
| 9,429,678 B2 | 8/2016 | Abitrabi et al. | |
| 10,108,167 B2 | 10/2018 | Suheil | |

(Continued)

FOREIGN PATENT DOCUMENTS

| | | |
|---|---|---|
| BR | 201000365 B1 | 4/2020 |
| CN | 207115139 U | 3/2018 |

(Continued)

OTHER PUBLICATIONS

MSA the safety company, NPL, "MSA Gas Detection H2S Flow Panel System", published Sep. 2015 (Year: 2015).*

(Continued)

*Primary Examiner* — Rehana Perveen
*Assistant Examiner* — Angel Calle
(74) *Attorney, Agent, or Firm* — Bracewell LLP; Constance G. Rhebergen; Brian H. Tompkins

(57) ABSTRACT

Provided is hydrocarbon reservoir production system and method that employs a production monitoring system including a well production monitoring system to obtain well production data and gas characteristics of hydrocarbons produced by wells associated with a production region of the reservoir. The production monitoring system adapted to receive selection of modeling parameters, including a selected region and time period, and to generate a set of well performance data including a production data and gas production data for the selected region and time period. A production modeling system adapted to generate, based on the set of well performance data, a model of the performance of the selected region. A production operations system adapted to regulate, based on simulation of the model, operation of wells in the selected region.

15 Claims, 4 Drawing Sheets

200

OBTAIN PRODUCTION DATA
202

RECEIVE SELECTION OF MODEL PARAMETERS
204

GENERATE WELL PERFORMANCE DATA
(BASED ON SELECTED MODEL PARAMETERS)
206

DETERMINE VALIDATED MODEL
(BASED ON WELL PERFORMANCE DATA)
208

DETERMINE PREDICTED GAS CHARACTERISTICS
(BASED ON VALIDATED MODEL)
210

OPERATE PRODUCTION SYSTEM
(BASED ON PREDICTED GAS CHARACTERISTICS)
212

(56) References Cited

U.S. PATENT DOCUMENTS

| | | | |
|---|---|---|---|
| 10,280,722 B2 | 5/2019 | Bello et al. | |
| 10,430,725 B2 | 10/2019 | Anderson et al. | |
| 11,162,331 B2 | 11/2021 | Babic | |
| 2015/0300151 A1 | 10/2015 | Mohaghegh | |
| 2019/0048703 A1 | 2/2019 | Samuel et al. | |
| 2020/0362670 A1 | 11/2020 | Alanazi et al. | |
| 2021/0042633 A1* | 2/2021 | Maucec | G06F 16/355 |
| 2021/0087925 A1 | 3/2021 | Heidari et al. | |
| 2021/0238971 A1 | 8/2021 | Crumpton | |
| 2021/0270998 A1 | 9/2021 | Madasu et al. | |
| 2021/0277749 A1 | 9/2021 | Alhuraifi et al. | |
| 2021/0301644 A1 | 9/2021 | Rao et al. | |
| 2022/0198333 A1* | 6/2022 | Pack | G06F 18/214 |

FOREIGN PATENT DOCUMENTS

| | | |
|---|---|---|
| CN | 111364953 A | 7/2020 |
| CN | 112766772 A | 5/2021 |
| CN | 113700455 A | 11/2021 |

OTHER PUBLICATIONS

Timur Bikmukhametov, NPL, "First Principles and Machine Learning Virtual Flow Metering: A Literature Review", Journal of Petroleum Science and Engineering, Published Sep. 10, 2019 (Year: 2019).*

Al Ghamdi, Bander N et al.; "Assessing Single EOS Predictability using PVT Properties of a Wet-Gas Reservoir on a Compositional Simulator" SPE-187453-MS, SPE Annual Technical Conference and Exhibition, San Antonio, Texas, Oct. 9-11, 2017; pp. 1-16.

Amini, Shohreh et al.; "Uncertainty Analysis of a CO2 Sequestration Project Using Surrogate Reservoir Modeling Technique" SPE 153843, SPE Western Regional Meeting Bakersfield, CA, Mar. 19-23, 2012; pp. 1-10.

Andreasen, Anders; "Applied Process Simulation-Driven Oil and Gas Separation Plant Optimization using Surrogate Modeling and Evolutionary Algorithms" Journal of Petroleum Science and Engineering, Apr. 23, 2019; pp. 1-35.

Firoozabadi, A. et al.; "EOS Predictions of Compressibility and Phase Behavior in Systems Containing Water, Hydrocarbons, and CO2" SPE Reservoir Engineering, May 1988; pp. 673-684.

Hu, D. et al.; "Natural gas production data integration and intelligent analysis system" (abstract only) Natural Gas Industry vol. 40, Issue 11, Nov. 25, 2020; pp. 1-4.

Singh, A. et al.; "Improving deepwater facility uptime using machine learning approach" (abstract only) SPE-195875-MS, SPE Annual Technical Conference & Exhibition 2019, ATCE 2019, Calgary, Alberta Sep. 30-Oct. 2, 2019; pp. 1-4.

Transportation Research Board Special Report 322; "Application of Remote Real-Time Monitoring to Offshore Oil and Gas Operations" The National Academies of Sciences, Engineering, Medicine; 2016; pp. 1-96.

Zangl, G. et al.; "Comparison of methods for stochastic multiphase flow rate estimation" (abstract only) SPE-170866-MS, SPE Annual Technical Conference and Exhibition, ATCE 2014, Amsterdam, Oct. 27-29, 2019; pp. 1-4.

AI Generated Summary; "Total Dissolved Gas Dynamics and Aquatic Health" nature research intelligence; available as of Sep. 5, 2025 at https://www.nature.com/research-intelligence/nri-topic-summaries/total-dissolved-gas-dynamics-and-aquatic-health-micro-9198; pp. 1-4.

* cited by examiner

HYDROCARBON GAS PRODUCTION SYSTEM

FIELD

Embodiments relate generally to developing hydrocarbon reservoirs, and more particularly to operation of hydrocarbon wells based on sales gas production.

BACKGROUND

A rock formation that resides beneath the Earth's surface is often referred to as a "subsurface" formation. A subsurface formation that contains a subsurface pool of hydrocarbons, such as oil and gas, is often referred to as a "hydrocarbon reservoir." Hydrocarbons are typically extracted (or "produced") from a hydrocarbon reservoir by way of hydrocarbon wells. A hydrocarbon well normally includes a wellbore (or "borehole") that is drilled into a reservoir to facilitate the extraction (or "production") of hydrocarbons, such as oil and gas, from the reservoir, the injection of substances into the reservoir, or the evaluation and monitoring of the reservoir.

Development of a hydrocarbon reservoir typically involves multiple phases and operations directed to optimizing extraction of the hydrocarbons from the reservoir. For example, a reservoir operator may spend a great deal of time and effort assessing a hydrocarbon reservoir to identify a field development plan (FDP) that outlines parameters for extracting hydrocarbons from the reservoir in economical and environmentally responsible manner. An FDP may, for example, specify operating parameters for wells in the reservoir, such as target production rates and pressures, and a reservoir operator may, in turn, operate the wells accordance with the FDP parameters.

SUMMARY

Reservoir simulation can be an important aspect of developing a hydrocarbon reservoir. In many instances, operators rely on simulations to characterize performance of a hydrocarbon reservoir and use the results of the simulations as a basis for developing the reservoir. For example, an operator may conduct simulations of different operating scenarios to generate estimates (or "predictions") of hydrocarbon production from the reservoir under the different scenarios, select a preferred scenario based on the estimates, and generate and employ a field development plan (FDP) that is consistent with the selected operating scenario. These types of assessments may be completed over the life of a reservoir, sometimes daily or weekly, in an effort to regularly assess and adjust reservoir operations for efficient and effective development of the reservoir.

Simulation of hydrocarbon reservoir production (or "production simulation") may involve processing (or "simulating") a model of reservoir production (or "production model") to predict the reservoir's hydrocarbon production characteristics for a set of operating parameters. A reservoir model is often built using historical reservoir data, and conditions of an operating a scenario are applied to the model to generate a prediction of reservoir performance under that scenario. For example, hydrocarbon reservoir modeling and simulation may involve collecting a set of historical production data for wells in the reservoir, generating a production model based on the historical production data, and conducting a production simulation that involves applying a set of operating parameters to the production model to generate a prediction of production characteristics, such as a predicted production rate, for the set of operating parameters.

Although simulations are a useful tool, they often suffer from limitations that can affect their accuracy, flexibility and usefulness. For example, models and simulations are typically built on a fixed set of set of historical data and may not provide an operator with flexibility to generate models and simulations dynamically, to explore results for custom sets of input data. This can limit an operator's ability to explore different modeling strategies, which can limit the operator's ability to fully understand the impact different reservoir operations on the behavior of the reservoir.

Provided are techniques for monitoring, modeling, simulating and operating a hydrocarbon reservoir based on dynamically defined modeling parameters. In some embodiments, a hydrocarbon reservoir production system includes a production monitoring system having (a) a well production monitoring system that collects well production data for wells in the reservoir and (b) a gas monitoring system having gas production sensors that are associated with a region in the system and operable to sense characteristics of gas in the production of the wells. The production monitoring system can provide for user selection of desired modeling parameters, including a selected region, a selected time period and a selected gas production sensor type, and, in response to receiving such a selection, generate a set of well gas performance data that includes corresponding data. The well gas performance data may include (a) well production data including a subset of the production data for a subset of the wells (i) in the selected region and (ii) measured in the selected time period, and (b) gas production data including gas characteristics sensed by gas production sensors (i) associated with the selected region and of the selected type of gas production sensor and (ii) measured in the selected time period. The gas production sensors may include different types of sensors (e.g., carbon dioxide ($CO_2$) sensors, hydrogen sulfide ($H_2S$) sensors, total dissolved gas (TDG) sensors, or the like), and the selection of one or more types of sensors may provide for gas production data including only gas characteristics (e.g., $CO_2$ content, $H_2S$ content, total dissolved gas content or the like) sensed by the selected types of sensors. In some embodiments, sensors are tagged (or otherwise associated) with a sensor type, well or region, and a set of well gas performance data includes data obtained from sensors tagged with a sensor type, well or region corresponding to the selected modeling parameters, including sensor type, well or region.

In some embodiments, the hydrocarbon reservoir production system further includes a production modeling system (e.g., a machine learning modeling system) that (1) divides the subset of the production data into (a) a training dataset, (b) a validation dataset, and (c) a testing dataset, (2) generates (using the training dataset) trained models of the performance of the subset of the wells located in the region selected (the models for use in determining predicted sales gas characteristics for the region based on production characteristics of the wells located in the given region), (3) conducts (e.g., by applying the validation dataset to the trained models of the performance of the subset of the wells located in the given region selected) a validation operation to select one of the models as a validated model, and (4) conducts (e.g., by applying the testing dataset to the validated model) a verification operation to verify accuracy of the validated model.

In some embodiments, the hydrocarbon reservoir production system further includes a production operations system that (1) determines (e.g., based on application of predicted well production data for the subset of the wells located in the given region to the validated model) predicted sales gas characteristics for the subset of the wells located in the given region, and (2) regulates (e.g., based on the predicted sales gas characteristics for the region) operation of one or more of the wells located in the given region selected.

Such a hydrocarbon reservoir production system may enable a user to dynamically generate and employ validated production models to predict sales gas characteristics (such as $CO_2$, $H_2S$ or TDG content) of a reservoir for different operating scenarios and data inputs, which can be used as a basis for defining and employing well operating parameters for wells in the reservoir.

Provided in some embodiments is a hydrocarbon reservoir production system that includes the following: a production monitoring system including: a well production monitoring system adapted to obtain well production data for wells in a hydrocarbon reservoir, the well production data including measured hydrocarbon production of the wells; and a gas production monitoring system including gas production sensors adapted to sense gas characteristics of hydrocarbons produced by the wells, each of the gas production sensors adapted to sense a characteristic of gas produced by one or more of the wells and being associated with a production region, the gas production monitoring system adapted to generate gas production data including measurements of gas characteristics sensed by the gas production sensors, each of the measurements being associated with a region of the gas production sensor and a time of measurement, the production monitoring system adapted to: receive, by way of a user interface, user selection of modeling parameters including a selected region and a selected time period; and generate, in response to receiving the selection of the modeling parameters, a set of well performance data including: well production data including a subset of the production data for a subset of the wells (i) in the selected region and (ii) measured in the selected time period; and gas production data including gas characteristics sensed by gas production sensors (i) associated with the selected region and (ii) measured in the selected time period; a production modeling system adapted to generate, based on the set of well performance data, a model of the performance of the subset of the wells located in the selected region; and a production operations system adapted to regulate, based on simulation of the model, operation of one or more of the wells in the selected region.

In some embodiments, the well production monitoring system includes production flowrate sensors and the measured hydrocarbon production of the wells includes measurements of flowrate of actual hydrocarbon production of the wells. In certain embodiments, the gas production sensors include different types of gas production sensors, where the modeling parameters include a selection of one or more of the different types of gas production sensors, and where the gas production data includes gas characteristics sensed by gas production sensors (i) associated with the selected region, (ii) measured in the selected time period, and (iii) of a type of gas production sensor selected. In some embodiments, the gas production sensors include carbon dioxide (CO2) content type sensors, hydrogen sulfide (H2S) content type sensors, and total dissolved gas content type sensors, and the modeling parameters includes a selection of one or more of the CO2 content type sensors, H2S content type sensors, and total dissolved gas content type sensors. In some embodiments, the generation of the model includes: dividing the set of well performance data into: a training dataset; a validation dataset; and a testing dataset; generating, using the training dataset, trained models of the performance of the subset of the wells located in the selected region, the models adapted to be used to determine predicted sales gas characteristics for the selected region based on production characteristics of the wells located in the selected region; conducting, by applying the validation dataset to the trained models, a validation operation to select one of the trained models as a validated model; and conducting, by applying the testing dataset to the validated model, a verification operation to verify accuracy of the validated model. In certain embodiments, the regulating of operation of the one or more of the wells in the selected region includes: determining, based on application of predicted well production data for the subset of the wells located in the selected region to the validated model, predicted sales gas characteristics for the subset of the wells located in the selected region; and regulating, based on the predicted sales gas characteristics for the selected region, operation of one or more of the wells in the selected region. In some embodiments, regulating operation of one or more of the wells located in the selected region includes: determining, based on the predicted sales gas characteristics for the region, target production flowrates for the wells in the selected region; and operating the wells in the selected region in accordance with the target production flowrates.

Provided in some embodiments is a method of producing hydrocarbons from a hydrocarbon reservoir, the method including: obtaining, by a well production monitoring system, well production data for wells in a hydrocarbon reservoir, the well production data including measured hydrocarbon production of the wells; sensing, by production sensors of a gas production monitoring system, gas characteristics of hydrocarbons produced by the wells, each of the gas production sensors sensing a characteristic of gas produced by one or more of the wells and being associated with a production region, generating, by the gas production monitoring system, gas production data including measurements of gas characteristics sensed by the gas production sensors, each of the measurements by a gas production sensor being associated with a region of the gas production sensor and a time of measurement; receiving, by way of a user interface of a production monitoring system, user selection of modeling parameters including a selected region and a selected time period; and generating, in response to receiving the selection of the modeling parameters, a set of well performance data including: well production data including a subset of the production data for a subset of the wells (i) in the selected region and (ii) measured in the selected time period; and gas production data including gas characteristics sensed by gas production sensors (i) associated with the selected region and (ii) measured in the selected time period; generating, by a production modeling system and based on the set of well performance data, a model of the performance of the subset of the wells located in the selected region; and regulating, by a production operations system and based on simulation of the model, operation of one or more of the wells in the selected region.

In some embodiments, the well production monitoring system includes production flowrate sensors and the measured hydrocarbon production of the wells includes measurements of flowrate of actual hydrocarbon production of the wells. In certain embodiments, the gas production sensors include different types of gas production sensors, where the modeling parameters includes a selection of one or more of the different types of gas production sensors, and where the gas production data includes gas characteristics sensed by gas production sensors (i) associated with the selected region, (ii) measured in the selected time period, and (iii) of a type of gas production sensor selected. In some embodiments, the gas production sensors include carbon dioxide ($CO_2$) content type sensors, hydrogen sulfide ($H_2S$) content type sensors, and total dissolved gas content type sensors, and the modeling parameters includes selection of one or more of the $CO_2$ content type sensors, $H_2S$ content type sensors, and total dissolved gas content type sensors. In certain embodiments, the generation of the model includes: dividing the set of well performance data into: a training dataset; a validation dataset; and a testing dataset; generating, using the training dataset, trained models of the performance of the subset of the wells located in the selected region, the models adapted to be used to determine predicted sales gas characteristics for the selected region based on production characteristics of the wells located in the selected region; conducting, by applying the validation dataset to the trained models, a validation operation to select one of the trained models as a validated model; and conducting, by applying the testing dataset to the validated model, a verification operation to verify accuracy of the validated model. In some embodiments, the regulating of operation of the one or more of the wells in the selected region includes: determining, based on application of predicted well production data for the subset of the wells located in the selected region to the validated model, predicted sales gas characteristics for the subset of the wells located in the selected region; and regulating, based on the predicted sales gas characteristics for the selected region, operation of one or more of the wells in the selected region. In certain embodiments, regulating operation of one or more of the wells located in the selected region includes: determining, based on the predicted sales gas characteristics for the region, target production flowrates for the wells in the selected region; and operating the wells in the selected region in accordance with the target production flowrates.

Provided in some embodiments is a non-transitory computer readable storage medium including program instructions stored thereon that are executable by a processor to perform the following operations for producing hydrocarbons from a hydrocarbon reservoir: obtaining, by a well production monitoring system, well production data for wells in a hydrocarbon reservoir, the well production data including measured hydrocarbon production of the wells; sensing, by way of production sensors of a gas production monitoring system, gas characteristics of hydrocarbons produced by the wells, each of the gas production sensors sensing a characteristic of gas produced by one or more of the wells and being associated with a production region; generating, by the gas production monitoring system, gas production data including measurements of gas characteristics sensed by the gas production sensors, each of the measurements by a gas production sensor being associated with a region of the gas production sensor and a time of measurement; receiving, by way of a user interface of a production monitoring system, user selection of modeling parameters including a selected region and a selected time period; and generating, in response to receiving the selection of the modeling parameters, a set of well performance data including: well production data including a subset of the production data for a subset of the wells (i) in the selected region and (ii) measured in the selected time period; and gas production data including gas characteristics sensed by gas production sensors (i) associated with the selected region and (ii) measured in the selected time period; generating, by a production modeling system and based on the set of well performance data, a model of the performance of the subset of the wells located in the selected region; and regulating, based on simulation of the model, operation of one or more of the wells in the selected region.

In some embodiments, the well production monitoring system includes production flowrate sensors and the measured hydrocarbon production of the wells includes measurements of flowrate of actual hydrocarbon production of the wells. In certain embodiments, the gas production sensors include different types of gas production sensors, where the modeling parameters include a selection of one or more of the different types of gas production sensors, and where the gas production data includes gas characteristics sensed by gas production sensors (i) associated with the selected region, (ii) measured in the selected time period, and (iii) of a type of gas production sensor selected. In some embodiments, the generation of the model includes: dividing the set of well performance data into: a training dataset; a validation dataset; and a testing dataset; generating, using the training dataset, trained models of the performance of the subset of the wells located in the selected region, the models adapted to be used to determine predicted sales gas characteristics for the selected region based on production characteristics of the wells located in the selected region; conducting, by applying the validation dataset to the trained models, a validation operation to select one of the trained models as a validated model; and conducting, by applying the testing dataset to the validated model, a verification operation to verify accuracy of the validated model. In certain embodiments, the regulating of operation of the one or more of the wells in the selected region includes: determining, based on application of predicted well production data for the subset of the wells located in the selected region to the validated model, predicted sales gas characteristics for the subset of the wells located in the selected region; and regulating, based on the predicted sales gas characteristics for the selected region, operation of one or more of the wells in the selected region. In some embodiments, regulating operation of one or more of the wells located in the selected region includes: determining, based on the predicted sales gas characteristics for the region, target production flowrates for the wells in the selected region; and controlling operation of the wells in the selected region in accordance with the target production flowrates.

Figure 1:
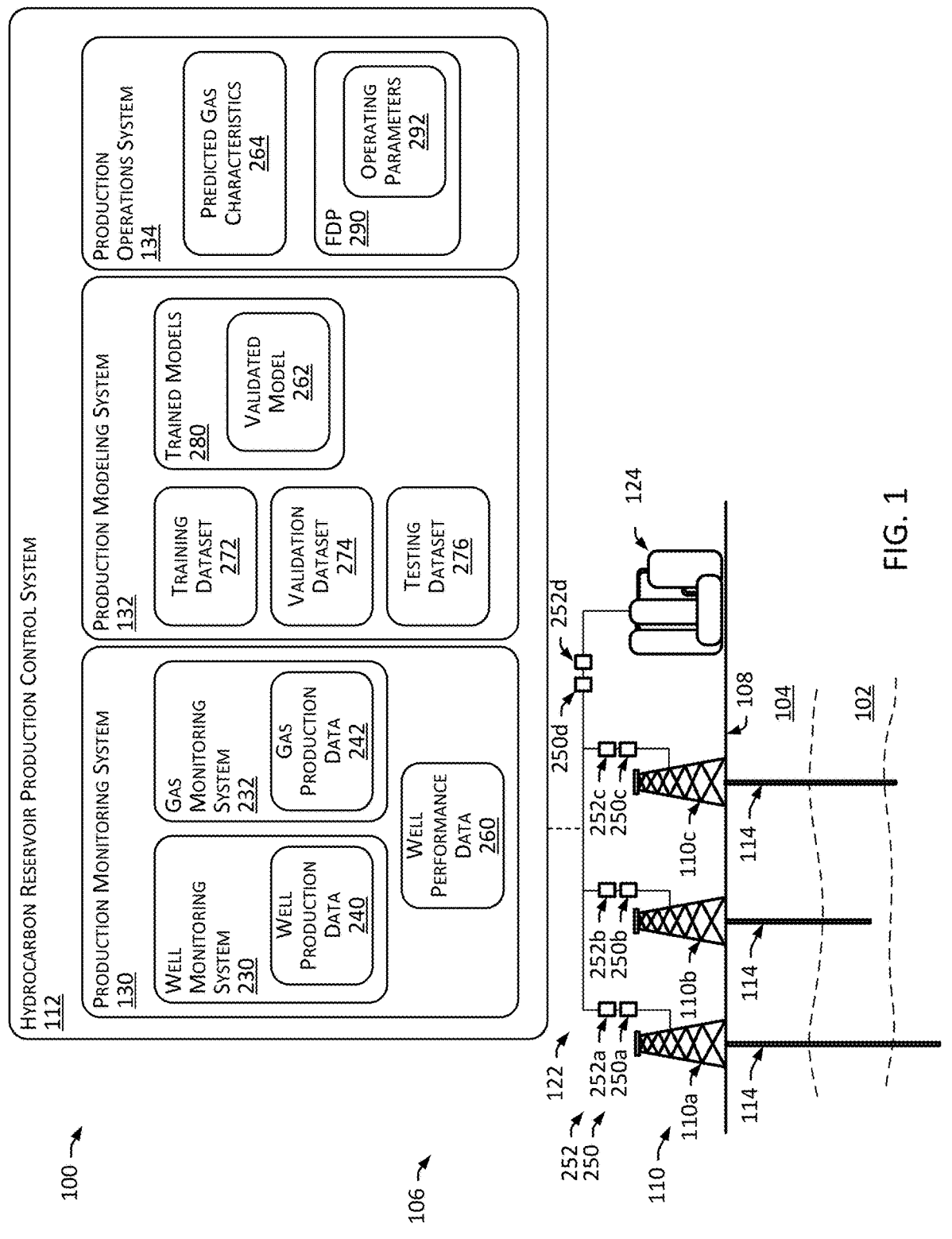
FIG. 1 is diagram that illustrates a well environment in accordance with one or more embodiments.

While this disclosure is susceptible to various modifications and alternative forms, specific embodiments are shown by way of example in the drawings and will be described in detail. The drawings may not be to scale. The drawings and the detailed descriptions are not intended to limit the disclosure to the form disclosed, but are intended to disclose modifications, equivalents, and alternatives falling within the scope of the disclosure as defined by the claims.

DETAILED DESCRIPTION

Described are embodiments of novel systems and method monitoring, modeling, simulating and operating a hydrocarbon reservoir based on dynamically defined modeling parameters. In some embodiments, a hydrocarbon reservoir production system includes a production monitoring system having (a) a well production monitoring system that collects well production data for wells in the reservoir and (b) a gas monitoring system having gas production sensors that are associated with a region in the system and operable to sense characteristics of gas in the production of the wells. The production monitoring system can provide for user selection of desired modeling parameters, including a selected region, a selected time period and a selected gas production sensor type, and, in response to receiving such a selection, generate a set of well gas performance data that includes corresponding data. The well gas performance data may include (a) well production data including a subset of the production data for a subset of the wells (i) in the selected region and (ii) measured in the selected time period, and (b) gas production data including gas characteristics sensed by gas production sensors (i) associated with the selected region and of the selected type of gas production sensor and (ii) measured in the selected time period. The gas production sensors may include different types of sensors (e.g., Carbon dioxide ($CO_2$) sensors, Hydrogen Sulfide ($H_2S$) sensors, total dissolved gas (TDG) sensors, or the like), and the selection of one or more types of sensors may provide for gas production data including only gas characteristics (e.g., $CO_2$ content, $H_2S$ content, total dissolved gas content or the like) sensed by the selected types of sensors.

In some embodiments, the hydrocarbon reservoir production system further includes a production modeling system (e.g., a machine learning modeling system) that (1) divides the subset of the production data into (a) a training dataset, (b) a validation dataset, and (c) a testing dataset, (2) generates (using the training dataset) trained models of the performance of the subset of the wells located in the region selected (the models for use in determining predicted sales gas characteristics for the region based on production characteristics of the wells located in the given region), (3) conducts (e.g., by applying the validation dataset to the trained models of the performance of the subset of the wells located in the given region selected) a validation operation to select one of the models as a validated model, and (4) conducts (e.g., by applying the testing dataset to the validated model) a verification operation to verify accuracy of the validated model.

In some embodiments, the hydrocarbon reservoir production system further includes include a production operations system that (1) determines (e.g., based on application of predicted well production data for the subset of the wells located in the given region to the validated model) predicted sales gas characteristics for the subset of the wells located in the given region, and (2) regulates (e.g., based on the predicted sales gas characteristics for the region) operation of one or more of the wells located in the given region selected.

FIG. 1 is a diagram that illustrates a reservoir environment 100 in accordance with one or more embodiments. In the illustrated embodiment, the reservoir environment 100 includes a reservoir ("reservoir") 102 located in a subsurface formation ("formation") 104, and a production system 106.

The formation 104 may include a porous or fractured rock formation that resides beneath the earth's surface (or "surface") 108. The reservoir 102 may be a hydrocarbon reservoir defined by a portion of the formation 104 that contains (or that is at least determined or expected to contain) a subsurface pool of hydrocarbons, such as oil and gas. The formation 104 and the reservoir 102 may each include layers of rock having varying characteristics, such as varying degrees of permeability, porosity, and fluid saturation.

In the illustrated embodiment, the production system 106 includes multiple well systems ("wells") 110 and a hydrocarbon reservoir production control system ("production control system") 112. Each of the wells 110 may, for example, be operated as a hydrocarbon production well (or "production well") that is operable to facilitate the extraction of hydrocarbons (or "production"), such as oil or gas, from the reservoir 102. Each of the wells 110 may include a wellbore 114 (e.g., created by a drill bit boring through the formation 104) having an outlet with a production tree that is connected to a distribution network of midstream facilities 122, such as tanks, pipelines or transport vehicles that provide for the that transport production from the well 110 to downstream facilities 124, such as refineries or export terminals.

In some embodiments, the production control system 112 includes a production monitoring system (or "monitoring system") 130, a production modeling system (or "modeling system") 132, and a production operations system (or "operations system") 134.

In some embodiments, the monitoring system 130 provides for monitoring of characteristics of production of the wells 110 (e.g., wells 110a-110c) of the production system 106. This may include, for example, monitoring rates of production of the wells 110 and characteristics of gas contained in the production, such as $CO_2$ content, $H_2S$ content, total dissolved gas (TDG) content or the like.

In the illustrated embodiment, the monitoring system 130 includes a well monitoring system 230 and a gas monitoring system 232. The well monitoring system 230 may be operable to obtain well production data 240 for the production system 106 and the gas monitoring system 232 may be operable to obtain gas production data 242 for the production system 106.

In some embodiments, the well production data 240 includes actual (or "observed") rates of production from some or all of the wells 110. For example, the well production data 240 may include, for each of the wells 110 (e.g., for each of wells 110a-110c), a record of flowrates measurements of production from the well 110 over a preceding year (e.g., timeseries data including flowrate measurements recorded every 10 minutes from Feb. 1, 2021-Jan. 31, 2022).

In some embodiments, the gas production data 242 includes actual (or "observed") gas characteristics of the production from some or all of the wells 110. For example, the gas production data 242 may include, for each of the wells 110 (e.g., for each of wells 110a-110c), a record of measurements of concentrations of different gases in the production from the well 110 over a preceding year (e.g., timeseries data including measurements of gas concentration, such as $CO_2$ content, $H_2S$ content, TDG content or the like, recorded every 10 minutes from Feb. 1, 2021-Jan. 31, 2022). The measured gas concentrations may be used to determine a content of the gas in a volume of the production.

In some embodiments, the well production data 240 is obtained by way of well production sensors 250 operable to measure production flow from the wells 110. For example, each of the wells 110 (e.g., each of wells 110a-110c) may have one or more well production sensors 250 (e.g., respective sensors 250a-250c) operable to measure the flowrate of production produced by the well 110, and the midstream facilities 122 may include one or more well production sensors 250 (e.g., sensor 250d) operable to measure the flow rate of comingled production produced by the wells 110 (e.g., comingled production from wells 110a-110c). A well production sensor 250 may include, for example, a flowrate sensor coupled to a production path (e.g., a production flowline) that measures the flowrate of production flowing in the path.

In some embodiments, the gas production data 242 is obtained by way of gas production sensors 252 operable to measure gas characteristics of production from the wells 110. For example, each of the wells 110 (e.g., each wells 110a-110c) may have one or more gas production sensors 252 (e.g., respective sensors 252a-252c) operable to measure the gas content of production produced by the wells 110, and the midstream facilities 122 may include one or more gas production sensors 252 (e.g., sensor 252d) operable to measure the gas content of comingled production produced by the wells 110 (e.g., comingled production from wells 110a-110c). A gas production sensor 252 may include, for example, a gas content sensor (e.g., a $CO_2$ content sensor, $H_2S$ content sensor, total dissolved gas content sensor, or the like) coupled to a production flow path (e.g., production flowline or the like) that measures concentrations of gas(es) (e.g., $CO_2$ content, $H_2S$ content, total dissolved gas content or the like) in the production flowing in the path. The gas production sensors 252a, 252b, 252c and 252d may include, for example, a $CO_2$ content sensor, a $H_2S$ content sensor, a $CO_2$ content sensor and a $CO_2$ content sensor, respectively.

In some embodiments, portions of the well production data 240 obtained by way of a production sensor 250 are associated with the production sensor 250 or one or more wells 110 associated with the production sensor 250. For example, flowrate data obtained from a flowrate type production sensor 250a measuring production from an outlet of the first well 110a may be "tagged" (or otherwise associated) with the first well 110a, a flowrate type sensor, and a corresponding region (e.g., its physical location or "region 1"). As a further example, flowrate data obtained from a flowrate type production sensor 250d measuring comingled production from the wells 110a-110c flowing in a midstream flowline may be "tagged" (or otherwise associated) with the wells 110a-110c, a flowrate type sensor, and a corresponding region (e.g., its physical location or "region 1"). The region may be, for example, a geographic location (e.g., latitude and longitude coordinates of the first well 110a or the sensor 250a) or a defined region within the production system 106. In the illustrated embodiment, example defined regions include "region 1" including the first well 110a, the first production sensor 250a, and the first gas production sensor 252a, "region 2" including the second well 110b, the second production sensor 250b, and the second gas production sensor 252b, "region 3" including the third well 110c, the third production sensor 250c, and the third gas production sensor 252c, and "region 4" including the fourth production sensor 250d and the fourth gas production sensor 252d.

In some embodiments, portions of the gas production data 242 obtained by way of a production sensor 250 are associated with the production sensor 250 or one or more wells 110 associated with the production sensor 250. For example, $CO_2$ content data obtained from a $CO_2$ type content sensor 252a measuring concentration of $CO_2$ in the production from an outlet of the first well 110a may be "tagged" (or otherwise associated) with the first well 110a, a $CO_2$ type content sensor, and "region 1." As a further example, $H_2S$ content data obtained from a $H_2S$ type content sensor 250d measuring $H_2S$ content of the comingled production from the wells 110a-110c flowing in a midstream flowline may be "tagged" (or otherwise associated) with the wells 110a-110c (based on them being the source of the production being measured), a $H_2S$ type content sensor, and a corresponding region (e.g., its physical location or "region 4").

In some embodiments, the monitoring system 130 provides for selection of modeling parameters that define a dataset to be used as a basis for modeling performance of the production system 106. For example, the monitoring system 130 may enable user selection of modeling parameters and generate, from the well production data 240 and the gas production data 242, a set of well performance data 260 that corresponds to the selected modeling parameters. For example, the monitoring system 130 may provide for presentation of an interactive user interface element (e.g., by way of a graphical user interface display) that enables a user to select modeling parameters including some or all of the following: one or more regions (e.g., geographic location(s), geographic area(s), or defined region(s)), one or more gas sensor types (e.g., $CO_2$ content sensor, $H_2S$ content sensor, or TDG content sensor), and one or more time periods (e.g., Jan. 1, 2022-Jan. 31, 2022).

In response to receiving selection of the modeling parameters (e.g., selection of the modeling parameters by a user using the interactive user interface), the monitoring system 130 may filter the well production data 240 and the gas production data 242 in accordance with the selected modeling parameters to generate a set of well performance data 260 that includes well production data 240 for the selected region(s), gas sensor type(s), and the time period(s). For example, in response to receiving selection of modeling parameters including: "region 1" and "region 2"; "$CO_2$ content sensor type" and "$H_2S$ content sensor type"; and "1/1/2022 to 1/31/2022", the monitoring system 130 may return a well performance data 260 that includes (a) a subset of the well production data 240 including flowrate measurements obtained by way of flowrate sensor(s) in region 1 and 2 (e.g., from production sensors 250a and 250b) and being associated with (e.g., having timestamps falling within) the timeframe of Jan. 1, 2022-Jan. 31, 2022, and (b) a subset of the gas production data 242 including measurements obtained by way of the $CO_2$ content sensor(s) and $H_2S$ content sensor(s) in regions 1 and 2 (e.g., $CO_2$ content sensor 252a and $H_2S$ content sensor 252b) and being associated with (e.g., having timestamps falling within) the timeframe of Jan. 1, 2022-Jan. 31, 2022. As another example, in response to receiving selection of modeling parameters including: "region 1", "region 2", and "region 4"; "$CO_2$ content sensor type"; and "1/1/2022 to 1/31/2022", the monitoring system 130 may return a well performance data 260 that includes (a) a subset of the well production data 240 including flowrate measurements obtained by way of the flowrate sensors in regions 1, 2 and 4 (e.g., from production sensors 250a, 250b and 250d) and being associated with (e.g., having timestamps falling within) the timeframe of Jan. 1, 2022-Jan. 31, 2022, and (b) a subset of the gas production data 242 including measurements obtained by way of $CO_2$ content sensor(s) in regions 1, 2 and 4 (e.g., $CO_2$ content sensors 252a and 252d) and being associated with (e.g., having timestamps falling within) the timeframe of Jan. 1, 2022-Jan. 31, 2022.

In some embodiments, the production modeling system 132 uses the well performance data 260 as a basis for modeling performance of the production system 106. For example, the production modeling system 132 may generate (e.g., using machine learning) a "validated" production model (or "validated model") 262 that can be used in a simulation operation to generate estimated (or "simulated" or "predicted") characteristics of production of the production system 106. The validated production model 262 may include, for example, a model to which sets of production parameters (e.g., including flowrate parameters) can be applied to determine corresponding sets of estimated (or "predicted") gas characteristics 264 of production of the production system 106 (e.g., such as predicted $CO_2$ content, $H_2S$ content, or TDG content of the production). The gas produced in production may be referred to as "sales gas" and the gas characteristics 264 may be referred to as "sales gas characteristics."

In some embodiments, the production modeling system 132 identifies subsets of the well performance data 260 and performs certain modeling operations using respective ones of the subsets to determine the validated production model 262. In some embodiments, the production modeling system 132 conducts a division operation to identify three subsets of the well performance data 260. For example, the production modeling system 132 may divide the well performance data 260 into three discrete subsets including a training dataset 272 (e.g., including the data associated with a first portion (e.g., 70%) of the time period represented by the well performance data 260), a validation dataset 274 (e.g., including the data associated with a second portion (e.g., 15%) of the time period represented by the well performance data 260), and a testing dataset 276 (e.g., including the data associated with a third portion (e.g., 15%) of the time period represented by the well performance data 260).

In some embodiments, the production modeling system 132 conducts a training operation using the training dataset 272 to generate a plurality of trained models 280. For example, in an instance where the production modeling system 132 generates ten trained models 280, the production modeling system 132 may identify ten different portions of the training dataset 272 and conduct a training operation on each of the ten different portions to generate ten respective trained models 280. The training may include machine learning that uses historical data inputs (e.g., the well production data 240 in the training dataset 272) and corresponding historical data outputs (e.g., the gas production data 242 in the training dataset 272) to generate one or more "trained" models that can be used to estimate (or "predict") outputs (e.g., production gas characteristics) for a given set of inputs (e.g., production flowrate). In some embodiments, the training operation includes conducting linear regression, polynomial regression, decision tress, Nearest Neighbor, support vector machines (SVM), or the like operations on the training dataset 272 to generate the trained models 280.

Figure 3:
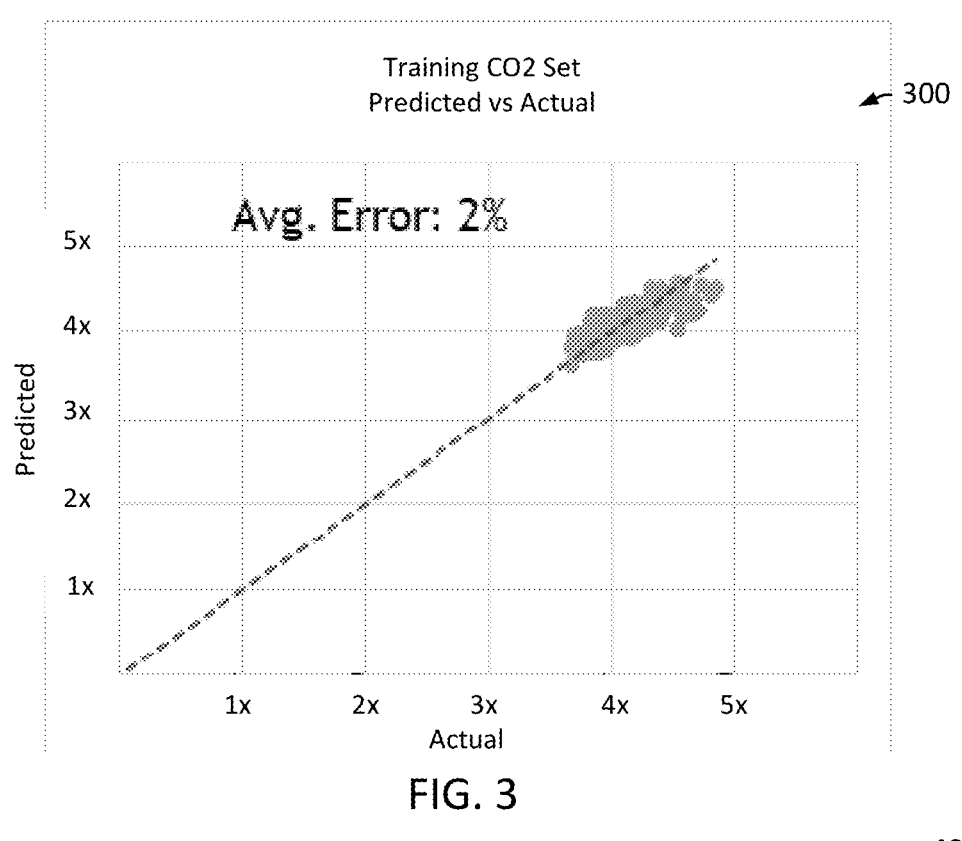
FIG. 3 is a diagram that illustrates results of a model validation operation in accordance with one or more embodiments.

In some embodiments, the production modeling system 132 conducts a validation operation to select a given one of the trained models 280 as a validated model 262. For example, the production modeling system 132 may conduct a validation operation that includes, for each of the trained models 280, applying the well production data 240 (e.g., production flowrates) of validation dataset 274 to the trained models 280 to generate a respective set of simulation results (e.g., estimated values of gas characteristics), and comparing the respective set of simulation results to the "observed" gas production data 242 of the validation dataset 274 to determine an amount of error between the respective set of simulation results and the "observed" gas production data 242 of the validation dataset 274, and selecting a trained model 280 having the smallest error as the validated model 262. FIG. 3 is diagram 300 that illustrates results of a model validation operation in accordance with one or more embodiments. The diagram 300 illustrates differences between observed (or "actual") gas characteristics and predicted gas characteristics and associated errors therebetween. In some embodiments, error between observed and predicted gas characteristics are determined by way of Mean Squared Error (MSE), Root Mean Squared Error (RMSE), Mean Absolute Error (MAE), or the like techniques.

In some embodiments, the production modeling system 132 conducts a verification operation to verify that the validated model 262 provides acceptable results. For example, the production modeling system 132 may conduct a verification operation that includes applying the well production data 240 (e.g., production flowrates) of testing dataset 276 to the validated model 262 to generate a respective set of simulation results (e.g., estimated values of gas characteristics), and comparing the respective set of simulation results to the "observed" gas production data 242 of the testing dataset 276 to determine an amount of error between the respective set of simulation results (generated by simulating the validated model 262) to the "observed" gas production data 242 of the testing dataset 276, where the validated model 262 is verified responsive to determining that the amount of error satisfies a threshold (e.g., the error is at or below 3%) and is not verified responsive to determining that the amount of error does not satisfy the threshold (e.g., the error is above 3%). In some embodiments, the amount of error is determined by way of Mean Squared Error (MSE), Root Mean Squared Error (RMSE), Mean Absolute Error (MAE), or the like techniques.

In some embodiments, the production operations system 134 generates predicted gas characteristics 264 using the validated model 262 and uses the predicted gas characteristics 264 as a basis for operating the production system 106. For example, the production operations system 134 (or another operator of the production system 106) may, responsive to the accuracy of the model 262 being verified, conduct simulations of the validated model 262 for different sets of potential production parameters to generate respective sets of estimated (or "predicted") gas characteristics 264 of production of the production system 106 (e.g., by applying each of the sets of production parameters to the validated model 262 to generate the respective sets of estimated (or "predicted") gas characteristics 264 of production of the production system 106), assess the sets of estimated (or "predicted") gas characteristics 264 of production of the production system 106 to determine a given one of the sets of estimated (or "predicted") gas characteristics 264 that satisfies sales gas criteria (e.g., the set of estimated (or "predicted") gas characteristics 264 that has a lowest $CO_2$, $H_2S$ or TDG content, or a $CO_2$, $H_2S$ or TDG content that satisfies a corresponding content threshold value, determine the set of production parameters (e.g., production flowrate for the wells 110) corresponding to the given set of estimated (or "predicted") gas characteristics 264, generate a FDP 290 that includes production operating parameters 292 consistent with the set of production parameters (e.g., including flowrate parameters for the wells 110 that correspond to the production flowrate for the wells 110 of the set of production parameters), and operate the production system 106 in accordance with the production operating parameters 292 of the FDP 290 (e.g., operate the wells 110 in accordance with the flowrate parameters of the FDP 290). In some embodiments, threshold values (e.g., for $CO_2$, $H_2S$ or TDG) are determined based on one or more production factors, such as plant design or reservoir characteristics. For example, a dome-type plant may be designed to handle a relatively high $H_2S$ concentration and, as a result, have a relatively high $H_2S$ threshold (e.g., in the range of about 3-4%). In contrast, another type of plant may be designed to handle a relatively low $H_2S$ concentration and, as a result, have a relatively low $H_2S$ threshold (e.g., in the range of about 2-3%).

In some embodiments, the production control system 112 is operable to execute the operations described herein, including control of various operations of the production system 106, including well production operations. The production control system 112 may include a production system memory and a production system processor that are operable to perform some or all the various processing and control operations of the production control system 112 described here. In some embodiments, the production control system 112 includes a computer system that is the same as or similar to that of computer system 1000 described with regard to at least FIG. 5.

Figure 2:
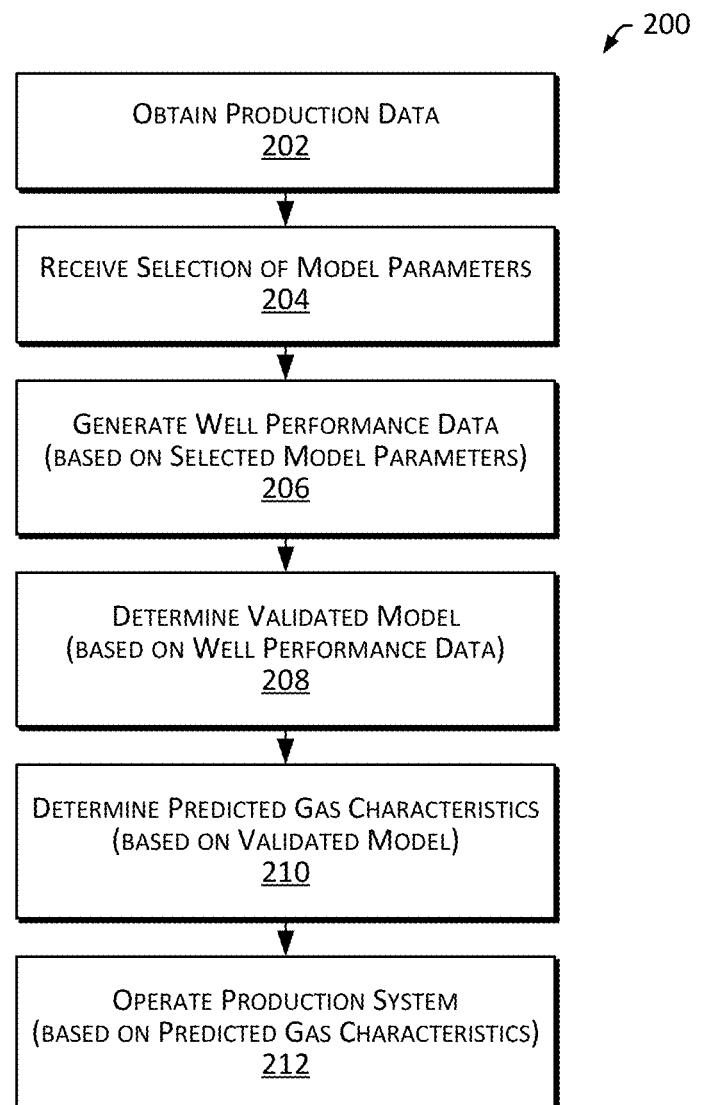
FIG. 2 is a flowchart that illustrates a method of operating a reservoir in accordance with one or more embodiments.

FIG. 2 is a flowchart that illustrates a method of operating a reservoir (e.g., including assessing and controlling production operations) in accordance with one or more embodiments. In some embodiments, some or all the operations described with regard to operating the reservoir may be executed or controlled by the production control system 112 (or another operator of the reservoir 102).

In some embodiments, method 200 includes obtaining production data (block 202). This may include obtaining historical well production data for a hydrocarbon reservoir production system (e.g., including production flowrate data for one or more wells in a reservoir over a preceding period of time) and historical gas production data (e.g., including gas characteristics of production from the one or more wells in a reservoir over the preceding period of time) for the production system, as described. For example, obtaining production data may include the well monitoring system 230 obtaining the well production data 240 for the production system 106, including, for each of the wells 110 (e.g., for each of wells 110a-110c) and midstream facilities 122, a record of flowrates measurements of production from the well 110 over a preceding year (e.g., timeseries data including flowrate measurements recorded every 10 minutes from Feb. 1, 2021-Jan. 31, 2022 by well production sensors 250a-250d), and for each of the wells 110 (e.g., for each of wells 110a-110c) and midstream facilities 122, a record of measurements of concentrations of different gases in the associated production streams over a preceding year (e.g., timeseries data including measurements of gas concentration, such as $CO_2$ content, $H_2S$ content, total dissolved gas content or the like, recorded every 10 minutes from Feb. 1, 2021-Jan. 31, 2022 by gas production sensors 252a-252d).

In some embodiments, method 200 includes receiving selection of model parameters (block 204). This may include receiving selection of modeling parameters that define a dataset to be used as a basis for modeling performance of the production system, as described. For example, receiving selection of model parameters may include the monitoring system 130 presenting an interactive user interface element (e.g., by way of a graphical user interface display) that enables a user to select modeling parameters including some or all of the following: one or more regions (e.g., geographic location(s), geographic area(s), or defined region(s)), one or more gas sensor types (e.g., $CO_2$ content sensor, $H_2S$ content sensor, or TDG content sensor), and one or more time periods (e.g., Jan. 1, 2022-Jan. 31, 2022), and receiving user selection of modeling parameters including: "region 1" and "region 2"; "$CO_2$ content sensor type" and "$H_2S$ content sensor type"; and "1/1/2022 to 1/31/2022".

In some embodiments, method 200 includes generating well performance data (block 206). This may include, in response to receiving selection of modeling parameters, generating (from the well production data and the gas production data) a set of well performance data 260 that corresponds to the selected modeling parameters, as described. For example, generating well performance data may include, in response to receiving selection of modeling parameters including: "region 1" and "region 2"; "$CO_2$ content sensor type" and "$H_2S$ content sensor type"; and "1/1/2022 to 1/31/2022", the monitoring system 130 generating well performance data 260 that includes (a) a subset of the well production data 240 including flowrate measurements obtained by way of flowrate sensor(s) in region 1 and 2 (e.g., from production sensors 250a and 250b) and being associated with (e.g., having timestamps falling within) the timeframe of Jan. 1, 2022-Jan. 31, 2022, and (b) a subset of the gas production data 242 including measurements obtained by way of the $CO_2$ content sensor(s) and $H_2S$ content sensor(s) in regions 1 and 2 (e.g., $CO_2$ content sensor 252a and $H_2S$ content sensor 252b) and being associated with (e.g., having timestamps falling within) the timeframe of Jan. 1, 2022-Jan. 31, 2022.

In some embodiments, method 200 includes determining a validated model of gas production (block 208). This may include, determining a validated model of gas production based on well performance data, as described. For example, determining a validated model of gas production may include the production modeling system 132 identifying subsets of the well performance data 260 and performing certain modeling operations using respective ones of the subsets to determine the validated production model 262. As described here, in some embodiments, the production modeling system 132 may divide the well performance data 260 into three discrete subsets including a training dataset 272, a validation dataset 274, and a testing dataset 276, conduct a training operation (using the training dataset 272) to generate a plurality of trained models 280, conduct a validation operation (using the validation dataset 274) to select a given one of the trained models 280 as a validated model 262, and conduct a verification operation (using the testing dataset 276) to verify that the validated model 262 provides acceptable results. The validated production model 262 may include, for example, a model to which sets of production parameters (e.g., including production flowrate parameters of the wells 110) can be applied to determine corresponding sets of estimated (or "predicted") gas characteristics 264 (e.g., such as $CO_2$ content, $H_2S$ content, or TDG content) of production of the production system 106.

In some embodiments, method 200 includes determining predicted gas characteristics (block 210). This may include generating predicted gas characteristics using the validated model, as described. For example, determining predicted gas characteristics may include the production operations system 134 (or another operator of the production system 106), responsive to the accuracy of the model 262 being verified, conducting simulations of the validated model 262 for different sets of potential production parameters to generate respective sets of estimated (or "predicted") gas characteristics 264 of production of the production system 106 (e.g., by applying each of the sets of production parameters to the validated model 262 to generate the respective sets of estimated (or "predicted") gas characteristics 264 of production of the production system 106). In some embodiments, the estimated gas characteristics 264 are used to identify production characteristics of certain ones of the wells 110. For example, the estimated gas characteristics 264 may be used to identify relative production character-istics between the wells 110, including "high" and "low" contributors (e.g., well with the greatest and least amount of sales gas contributions to production of the production system 106).

In some embodiments, method 200 includes operating the production system (block 212). This may include operating the production system based on the estimated (or "pre-dicted") gas characteristics, as described. For example, operating the production system may include the production operations system 134 (or another operator of the production system 106) assessing the sets of estimated (or "predicted") gas characteristics 264 of production of the production system 106 to determine a given one of the sets of estimated (or "predicted") gas characteristics 264 that satisfies a sales gas criteria (e.g., the set of estimated (or "predicted") gas characteristics 264 that has a lowest $CO_2$, $H_2S$ or dissolved gas content, or a $CO_2$, $H_2S$ or dissolved gas content that satisfies a corresponding threshold value), determining the set of production parameters (e.g., production flowrate for the wells 110) corresponding to the given set of estimated (or "predicted") gas characteristics 264, generating a FDP 290 that includes production operating parameters 292 consis-tent with the set of production parameters (e.g., including flowrate parameters for the wells 110 that correspond to the set of production parameters (e.g., to the production flowrate for the wells 110 of the set of production parameters), and operating the production system 106 in accordance with the production operating parameters 292 of the FDP 290 (e.g., operating the wells 110 in accordance with the flowrate parameters of the FDP 290). This may include controlling valves/chokes or similar mechanisms of the production system 106 used to regulate the flow of production from the wells 110 in accordance with "target" flowrate parameters of the FDP 290.

Figure 4:
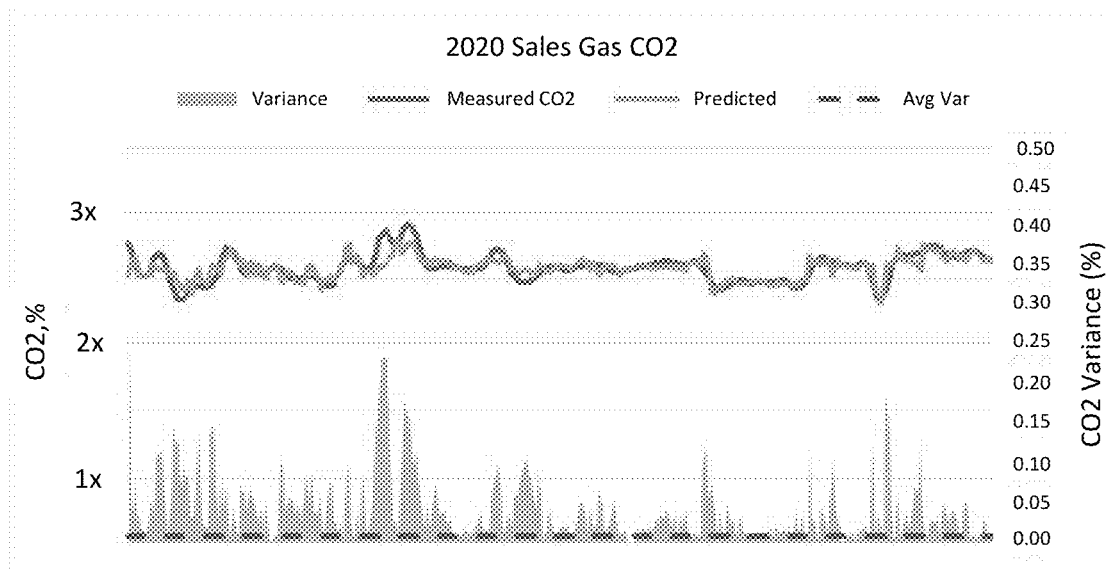
FIG. 4 is a diagram that illustrates variance of predicted gas characteristics in accordance with one or more embodiments.

The techniques describe here may provide for an operator dynamically generating and employ validated production models to predict sales gas characteristics (such as $CO_2$, $H_2S$ or TDG content) of a reservoir for different operating scenarios and data inputs, which can, in turn, be used as a basis for defining and employing well operating parameters for wells in the reservoir. This may provide for generation and use of production model that can generate predicted sales gas characteristics that closely track actual (or "observed" or "measured") sales gas characteristics for a set of operating conditions. FIG. 4 is a diagram 400 that illustrates a low variance of sales gas characteristics (e.g., predicted using the described techniques) relative to actual (or "observed" or "measured") sales gas characteristics, which illustrates the effectiveness of the described assess-ment, modeling, and operating techniques.

Figure 5:
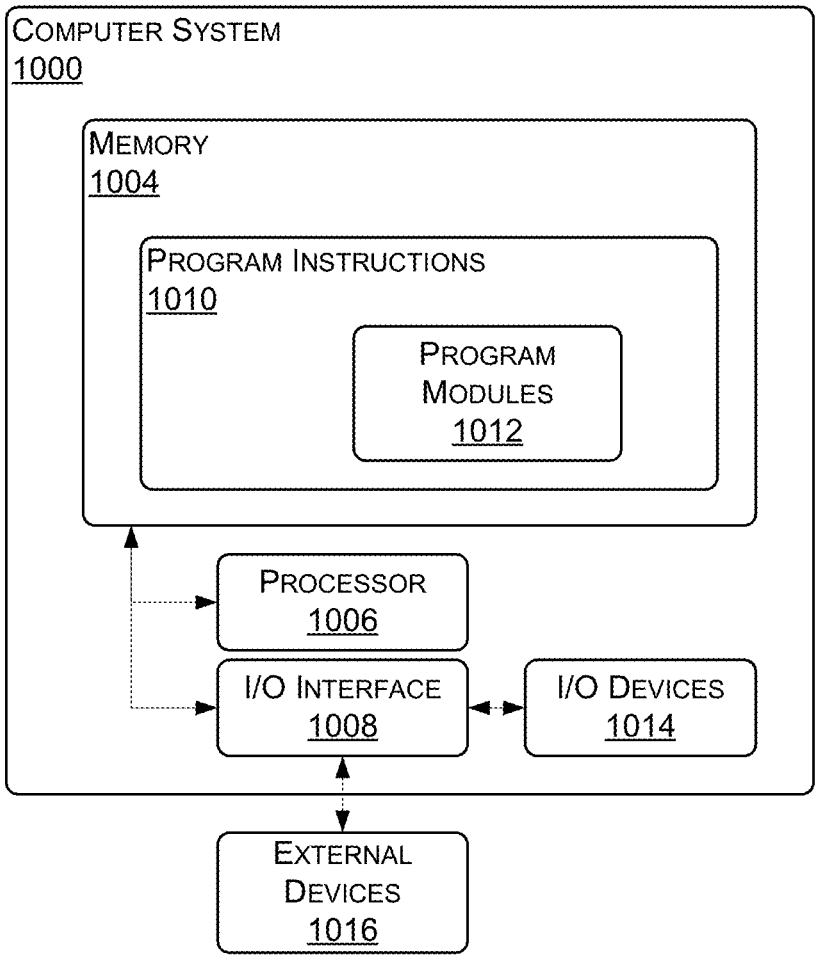
FIG. 5 is a diagram that illustrates an example computer system in accordance with one or more embodiments.

FIG. 5 is a diagram that illustrates an example computer system (or "system") 1000 in accordance with one or more embodiments. In some embodiments, the system 1000 is a programmable logic controller (PLC). The system 1000 may include a memory 1004, a processor 1006 and an input/output (I/O) interface 1008. The memory 1004 may include non-volatile memory (e.g., flash memory, read-only memory (ROM), programmable read-only memory (PROM), eras-able programmable read-only memory (EPROM), electri-cally erasable programmable read-only memory (EE-PROM)), volatile memory (e.g., random access memory (RAM), static random-access memory (SRAM), synchro-nous dynamic RAM (SDRAM)), or bulk storage memory (e.g., CD-ROM or DVD-ROM, hard drives). The memory 1004 may include a non-transitory computer-readable stor-age medium having program instructions 1010 stored thereon. The program instructions 1010 may include pro-gram modules 1012 that are executable by a computer processor (e.g., by the processor 1006) to cause the func-tional operations described, such as those described with regard to the production system 106, the production control system 112, the monitoring system 130, the modeling sys-tem 132, the operations system 134, or the method 200.

The processor 1006 may be any suitable processor capable of executing program instructions. The processor 1006 may include a central processing unit (CPU) that carries out program instructions (e.g., the program instruc-tions of the program modules 1012) to perform the arith-metical, logical, or input/output operations described. The processor 1006 may include one or more processors. The I/O interface 1008 may provide an interface for communication with one or more I/O devices 1014, such as a joystick, a computer mouse, a keyboard, or a display screen (for example, an electronic display for displaying a graphical user interface (GUI)). The I/O devices 1014 may include one or more of the user input devices. The I/O devices 1014 may be connected to the I/O interface 1008 by way of a wired connection (e.g., an Industrial Ethernet connection) or a wireless connection (e.g., a Wi-Fi connection). The I/O interface 1008 may provide an interface for communication with one or more external devices 1016. In some embodi-ments, the I/O interface 1008 includes one or both of an antenna and a transceiver. The external devices 1016 may include, for example, devices of the production system 106, such as the well production sensors 250, the gas production sensors 252 and valves/chokes or similar mechanisms used to regulate production flow from the wells 110.

Further modifications and alternative embodiments of various aspects of the disclosure will be apparent to those skilled in the art in view of this description. Accordingly, this description is to be construed as illustrative only and is for the purpose of teaching those skilled in the art the general manner of carrying out the embodiments. It is to be under-stood that the forms of the embodiments shown and described here are to be taken as examples of embodiments. Elements and materials may be substituted for those illus-trated and described here, parts and processes may be reversed or omitted, and certain features of the embodiments may be utilized independently, all as would be apparent to one skilled in the art after having the benefit of this descrip-tion of the embodiments. Changes may be made in the elements described here without departing from the spirit and scope of the embodiments as described in the following claims. Headings used here are for organizational purposes only and are not meant to be used to limit the scope of the description.

It will be appreciated that the processes and methods described here are example embodiments of processes and methods that may be employed in accordance with the techniques described here. The processes and methods may be modified to facilitate variations of their implementation and use. The order of the processes and methods and the operations provided may be changed, and various elements may be added, reordered, combined, omitted, modified, and so forth. Portions of the processes and methods may be implemented in software, hardware, or a combination of software and hardware. Some or all the portions of the processes and methods may be implemented by one or more of the processors/modules/applications described here.

As used throughout this application, the word "may" is used in a permissive sense (that is, meaning having the potential to), rather than the mandatory sense (that is, meaning must). The words "include," "including," and "includes" mean including, but not limited to. As used throughout this application, the singular forms "a", "an," and "the" include plural referents unless the content clearly indicates otherwise. Thus, for example, reference to "an element" may include a combination of two or more elements. As used throughout this application, the term "or" is used in an inclusive sense, unless indicated otherwise. That is, a description of an element including A or B may refer to the element including one or both of A and B. As used throughout this application, the phrase "based on" does not limit the associated operation to being solely based on a particular item. Thus, for example, processing "based on" data A may include processing based at least in part on data A and based at least in part on data B, unless the content clearly indicates otherwise. As used throughout this application, the term "from" does not limit the associated operation to being directly from. Thus, for example, receiving an item "from" an entity may include receiving an item directly from the entity or indirectly from the entity (for example, by way of an intermediary entity). Unless specifically stated otherwise, as apparent from the discussion, it is appreciated that throughout this specification discussions utilizing terms such as "processing," "computing," "calculating," "determining," or the like refer to actions or processes of a specific apparatus, such as a special purpose computer or a similar special purpose electronic processing/computing device. In the context of this specification, a special purpose computer or a similar special purpose electronic processing/computing device is capable of manipulating or transforming signals, typically represented as physical, electronic or magnetic quantities within memories, registers, or other information storage devices, transmission devices, or display devices of the special purpose computer or similar special purpose electronic processing/computing device.

What is claimed is:

1. A hydrocarbon reservoir production system comprising:
    a production monitoring system comprising:
        a well production monitoring system configured to obtain well production data for wells in a hydrocarbon reservoir, the well production data comprising measured hydrocarbon production of the wells in a first production region and wells in a second production region; and
        a gas production monitoring system comprising gas production sensors configured to sense gas characteristics of hydrocarbons produced by the wells, each of the gas production sensors configured to sense a characteristic of gas produced by one or more of the wells and being associated with a first production region or a second production region, the gas production monitoring system configured to generate gas production data comprising measurements of gas characteristics sensed by the gas production sensors, each of the measurements being associated with a production region of the gas production sensor and a time of measurement, wherein the gas production sensors comprise carbon dioxide ($CO_2$) content type sensors, hydrogen sulfide ($H_2S$) content type sensors, and total dissolved gas content type sensors, the gas production monitoring system configured to:
            receive, by way of a user interface, user selection of modeling parameters comprising a selected region and a selected time period; and
            generate, in response to receiving the selection of the modeling parameters, a set of well performance data comprising:

well production data comprising a subset of the production data for a subset of the wells (i) in the selected region and (ii) measured in the selected time period; and
                gas production data comprising gas characteristics sensed by gas production sensors (i) associated with the selected region and (ii) measured in the selected time period;
    a production modeling system configured to generate, based on the set of well performance data, a model of the performance of the subset of the wells located in the selected region and identify a first well having the greatest amount of sales gas contributions to production of the hydrocarbon reservoir production system and a second well having the least amount of sales gas contributions to production of the hydrocarbon reservoir production system;
    a production operations system configured to regulate, based on simulation of the model, operation of one or more of the wells in the selected region, wherein regulating operation of one or more of the wells located in the selected region comprises:
        determining, based on application of predicted well production data for the subset of the wells located in the selected region to the validated model, sets of predicted sales gas characteristics for the subset of the wells located in the selected region;
        assessing the predicted sales gas characteristics to determine a select one of the sets of predicted sales gas characteristics that satisfies a sales gas criteria;
        determining, based on determined select one of the sets of predicted sales gas characteristics, target production flowrates for the wells in the selected region and
        operating the wells in the selected region in accordance with the target production flowrates by controlling valves associated with the wells.

2. The system of claim 1, wherein the well production monitoring system comprises production flowrate sensors and the measured hydrocarbon production of the wells comprises measurements of flowrate of actual hydrocarbon production of the wells.

3. The system of claim 1, wherein the gas production sensors comprise different types of gas production sensors, wherein the modeling parameters comprise a selection of one or more of the different types of gas production sensors, and wherein the gas production data comprises gas characteristics sensed by gas production sensors (i) associated with the selected region, (ii) measured in the selected time period, and (iii) of a type of gas production sensor selected.

4. The system of claim 3, wherein the modeling parameters comprise a selection of one or more of the $CO_2$ content type sensors, $H_2S$ content type sensors, and total dissolved gas content type sensors.

5. The system of claim 1, wherein the generation of the model comprises:
    dividing the set of well performance data into:
        a training dataset;
        a validation dataset; and
        a testing dataset;
    generating, using the training dataset, trained models of the performance of the subset of the wells located in the selected region, the models configured to determine predicted sales gas characteristics for the selected region based on production characteristics of the wells located in the selected region;

conducting, by applying the validation dataset to the trained models, a validation operation to select one of the trained models as a validated model; and conducting, by applying the testing dataset to the validated model, a verification operation to verify accuracy of the validated model.

6. The system of claim 1, wherein the sales gas criteria comprises a lowest $CO_2$, $H_2S$ or total dissolved gas (TDG) content or a corresponding threshold value for $CO_2$, $H_2S$ or total dissolved gas (TDG) content.

7. A method of producing hydrocarbons from a hydrocarbon reservoir, the method comprising:

obtaining, by a well production monitoring system, well production data for wells in a hydrocarbon reservoir, the well production data comprising measured hydrocarbon production of the wells in a first production region and wells in a second production region;

sensing, by production sensors of a gas production monitoring system, gas characteristics of hydrocarbons produced by the wells, each of the gas production sensors sensing a characteristic of gas produced by one or more of the wells and being associated with a first production region or a second production region, generating, by the gas production monitoring system, gas production data comprising measurements of gas characteristics sensed by the gas production sensors, each of the measurements by a gas production sensor being associated with a production region of the gas production sensor and a time of measurement, wherein the gas production sensors comprise carbon dioxide ($CO_2$) content type sensors, hydrogen sulfide ($H_2S$) content type sensors, and total dissolved gas content type sensors;

receiving, by way of a user interface of a production monitoring system, user selection of modeling parameters comprising a selected region and a selected time period; and generating, in response to receiving the selection of the modeling parameters, a set of well performance data comprising:

well production data comprising a subset of the production data for a subset of the wells (i) in the selected region and (ii) measured in the selected time period; and gas production data comprising gas characteristics sensed by gas production sensors (i) associated with the selected region and (ii) measured in the selected time period;

generating, by a production modeling system and based on the set of well performance data, a model of the performance of the subset of the wells located in the selected region;

identifying, by a production modeling system and based on the model, a first well having the greatest amount of sales gas contributions to production of the hydrocarbon reservoir production system and a second well having the least amount of sales gas contributions to production of the hydrocarbon reservoir production system;

regulating, by a production operations system and based on simulation of the model, operation of one or more of the wells in the selected region, wherein regulating operation of one or more of the wells located in the selected region comprises:

determining, based on application of predicted well production data for the subset of the wells located in the selected region to the validated model, sets of predicted sales gas characteristics for the subset of the wells located in the selected region;

assessing the sales gas characteristics to determine a select one of the sets of predicted sales gas characteristics that satisfies a sales gas criteria;

determining, based on determined select one of the sets of predicted sales gas characteristics, target production flowrates for the wells in the selected region and operating the wells in the selected region in accordance with the target production flowrates by controlling valves associated with the wells.

8. The method of claim 7, wherein the well production monitoring system comprises production flowrate sensors and the measured hydrocarbon production of the wells comprises measurements of flowrate of actual hydrocarbon production of the wells.

9. The method of claim 7, wherein the gas production sensors comprise different types of gas production sensors, wherein the modeling parameters comprise a selection of one or more of the different types of gas production sensors, and wherein the gas production data comprises gas characteristics sensed by gas production sensors (i) associated with the selected region, (ii) measured in the selected time period, and (iii) of a type of gas production sensor selected.

10. The method of claim 9, wherein the modeling parameters comprise a selection of one or more of the $CO_2$ content type sensors, $H_2S$ content type sensors, and total dissolved gas content type sensors.

11. The method of claim 7, wherein the generation of the model comprises:

dividing the set of well performance data into:

a training dataset;

a validation dataset; and a testing dataset;

generating, using the training dataset, trained models of the performance of the subset of the wells located in the selected region, the models configured to determine predicted sales gas characteristics for the selected region based on production characteristics of the wells located in the selected region;

conducting, by applying the validation dataset to the trained models, a validation operation to select one of the trained models as a validated model; and conducting, by applying the testing dataset to the validated model, a verification operation to verify accuracy of the validated model.

12. A non-transitory computer readable storage medium comprising program instructions stored thereon that are executable by a processor to perform the following operations for producing hydrocarbons from a hydrocarbon reservoir:

obtaining, by a well production monitoring system, well production data for wells in a hydrocarbon reservoir, the well production data comprising measured hydrocarbon production of the wells in a first production region and wells in a second production region;

sensing, by way of production sensors of a gas production monitoring system, gas characteristics of hydrocarbons produced by the wells, each of the gas production sensors sensing a characteristic of gas produced by one or more of the wells and being associated with a first production region or a second production region, generating, by the gas production monitoring system, gas production data comprising measurements of gas characteristics sensed by the gas production sensors, each of the measurements by a gas production sensor being associated with a production region of the gas production sensor and a time of measurement, wherein the gas production sensors comprise carbon dioxide ($CO_2$) content type sensors, hydrogen sulfide ($H_2S$) content type sensors, and total dissolved gas content type sensors;

receiving, by way of a user interface of a production monitoring system, user selection of modeling parameters comprising a selected region and a selected time period; and generating, in response to receiving the selection of the modeling parameters, a set of well performance data comprising:

well production data comprising a subset of the production data for a subset of the wells (i) in the selected region and (ii) measured in the selected time period; and gas production data comprising gas characteristics sensed by gas production sensors (i) associated with the selected region and (ii) measured in the selected time period;

generating, by a production modeling system and based on the set of well performance data, a model of the performance of the subset of the wells located in the selected region;

identifying, by a production modeling system and based on the model, a first well having the greatest amount of sales gas contributions to production of the hydrocarbon reservoir production system and a second well having the least amount of sales gas contributions to production of the hydrocarbon reservoir production system;

regulating, by a production operations system and based on simulation of the model, operation of one or more of the wells in the selected region, wherein regulating operation of one or more of the wells located in the selected region comprises:

determining, based on application of predicted well production data for the subset of the wells located in the selected region to the model, sets of predicted sales gas characteristics for the subset of the wells located in the selected region;

assessing the sales gas characteristics to determine a select one of the sets of predicted sales gas characteristics that satisfies a sales gas criteria;

determining, based on determined select one of the sets of predicted sales gas characteristics, target production flowrates for the wells in the selected region and operating the wells in the selected region in accordance with the target production flowrates by controlling valves associated with the wells.

13. The medium of claim 12, wherein the well production monitoring system comprises production flowrate sensors and the measured hydrocarbon production of the wells comprises measurements of flowrate of actual hydrocarbon production of the wells.

14. The medium of claim 12, wherein the gas production sensors comprise different types of gas production sensors, wherein the modeling parameters comprise a selection of one or more of the different types of gas production sensors, and wherein the gas production data comprises gas characteristics sensed by gas production sensors (i) associated with the selected region, (ii) measured in the selected time period, and (iii) of a type of gas production sensor selected.

15. The medium of claim 12, wherein the generation of the model comprises:

dividing the set of well performance data into:
  a training dataset;
  a validation dataset; and
  a testing dataset;

generating, using the training dataset, trained models of the performance of the subset of the wells located in the selected region, the models configured to determine predicted sales gas characteristics for the selected region based on production characteristics of the wells located in the selected region;

conducting, by applying the validation dataset to the trained models, a validation operation to select one of the trained models as a validated model; and conducting, by applying the testing dataset to the validated model, a verification operation to verify accuracy of the validated model.

\* \* \* \* \*